US007863582B2

(12) United States Patent
Godyak

(10) Patent No.: US 7,863,582 B2
(45) Date of Patent: Jan. 4, 2011

(54) ION-BEAM SOURCE

(76) Inventor: Valery Godyak, 367 Harvard St. #2, Brookline, MA (US) 02446

( * ) Notice: Subject to any disclaimer, the term of this patent is extended or adjusted under 35 U.S.C. 154(b) by 361 days.

(21) Appl. No.: 12/011,160

(22) Filed: Jan. 25, 2008

(65) Prior Publication Data

US 2009/0189083 A1 Jul. 30, 2009

(51) Int. Cl.
*C23C 16/00* (2006.01)
*H01J 27/00* (2006.01)
*H01T 23/00* (2006.01)

(52) U.S. Cl. ................. 250/424; 250/423 R; 250/423 F

(58) Field of Classification Search ................. 250/251, 250/423 R, 423 F, 492.1; 315/111.21, 111.41, 315/111.51; 118/723 IR, 723 I; 216/67, 216/68; 313/46, 231.31

See application file for complete search history.

(56) References Cited

U.S. PATENT DOCUMENTS

| | | | | |
|---|---|---|---|---|
| 4,259,145 | A | 3/1981 | Harper et al. | |
| 4,447,732 | A | 5/1984 | Leung et al. | |
| 4,481,062 | A | 11/1984 | Kaufman et al. | |
| 4,862,032 | A | 8/1989 | Kaufman et al. | |
| 5,108,535 | A * | 4/1992 | Ono et al. | 156/345.35 |
| 5,434,353 | A * | 7/1995 | Kraus | 174/15.6 |
| 5,541,482 | A * | 7/1996 | Siao | 315/248 |
| 5,747,917 | A * | 5/1998 | Herchen | 313/231.31 |
| 6,077,402 | A * | 6/2000 | Hong et al. | 204/192.12 |
| 6,178,920 | B1 * | 1/2001 | Ye et al. | 118/723 I |
| 6,184,625 | B1 * | 2/2001 | Ogura et al. | 315/111.81 |
| 6,376,978 | B1 * | 4/2002 | Leung et al. | 313/359.1 |
| 6,444,084 | B1 * | 9/2002 | Collins | 156/345.1 |
| 6,464,891 | B1 * | 10/2002 | Druz et al. | 216/67 |
| 6,511,575 | B1 * | 1/2003 | Shindo et al. | 355/30 |
| 6,694,915 | B1 * | 2/2004 | Holland et al. | 118/723 I |
| 6,777,699 | B1 * | 8/2004 | Miley et al. | 250/492.3 |
| 6,803,585 | B2 | 10/2004 | Glukhoy | |
| 6,985,553 | B2 * | 1/2006 | Leung et al. | 376/158 |
| 7,176,469 | B2 * | 2/2007 | Leung et al. | 250/423 R |
| 7,205,723 | B2 * | 4/2007 | Kurachi et al. | 313/631 |
| 7,557,362 | B2 * | 7/2009 | Yevtukhov et al. | 250/423 R |
| 2002/0008451 | A1 * | 1/2002 | Gibson | 313/231.31 |
| 2002/0056416 | A1 * | 5/2002 | Sharan et al. | 118/723 E |
| 2003/0222557 | A1 * | 12/2003 | Kurachi et al. | 313/46 |

(Continued)

OTHER PUBLICATIONS

An article contained in http://casetechnology.com/implanter/source.html (see attached hard copy) describes a known ICP (inductance plasma) source that has arrays of permanent magnets used to produce a multi-cusp magnetic field in regions remote from plasma grids and an RF antenna that is formed by a wire coil, Jun. 6, 2009.

*Primary Examiner*—Jack I Berman
*Assistant Examiner*—Brooke Purinton
(74) *Attorney, Agent, or Firm*—Daniel L. Flamm

(57) ABSTRACT

An ion-beam source comprising: a plasma-generation unit for generating plasma and an ion-extraction unit for extraction and acceleration of ions from the aforementioned plasma, where the ion-extraction unit is made in the form of at least one grid under a negative potential. The plasma generating unit consists of a working chamber having a deeply immersed antenna cell. The cell contains a ferromagnetic core, a heat conductor with a heat sink, at least one inductive coil wound onto the ferromagnetic core, and a cap made from a dielectric material that sealingly covers the ferromagnetic core and the inductive coil.

9 Claims, 5 Drawing Sheets

U.S. PATENT DOCUMENTS

2006/0017011 A1 1/2006 Shang
2006/0071584 A1* 4/2006 Kurachi et al. .............. 313/156
2006/0124059 A1* 6/2006 Kim et al. ................. 118/723 I
2006/0289409 A1* 12/2006 Choi et al. ............. 219/121.57
2007/0170867 A1 7/2007 Persing et al.
2007/0188920 A1* 8/2007 Choi et al. .................. 360/126
2007/0194245 A1* 8/2007 Yevtukhov et al. .... 250/396 ML
2008/0020574 A1* 1/2008 Marakhtanov et al. ...... 438/689
2008/0042591 A1* 2/2008 Smith et al. ................. 315/248

* cited by examiner

ION-BEAM SOURCE

FIELD OF THE INVENTION

The preset invention is related to a charged-particle source and particular to an ion-beam source based on the use of a new method of excitation of plasma by means of an immersed antenna cell or array of RF antenna cells having a ferromagnetic core or cores, respectively. The ion source of the invention may find application in systems that require obtaining high ion currents for treating surfaces of semiconductor wafers with an ion beam, implanting impurities, etching, application of coatings, space propulsion, etc.

BACKGROUND OF THE INVENTION

A typical source of charged particles, such as electrons or positive ions, which is intended for extraction of electrons or ions, includes a plasma chamber made of graphite, stainless steel, aluminum, etc., and an extraction electrode system for extracting charged particles confined in the plasma chamber. The plasma chamber of a typical ion source consists of a top wall, side walls, and a bottom wall. A plurality of permanent magnets forming a multi-cusp magnetic field for confining plasma is provided at the top and side walls. A gas supply opening for the ion source gas and an antenna introduction opening are provided at the top wall, while the ion extraction system having opened outlets for extracting ion beams are provided at the bottom wall. The extraction electrode system works to extract the ion beams through electric fields of plasma, and the system is usually formed of a plurality of electrodes such as a plasma electrode, an extraction electrode, a suppression electrode, and a ground electrode.

It is desirable to provide the aforementioned ion-beam sources that produce high ion current at moderate ion energy, and this requirement leads to the concept of the so-called broad-beam ion source. The ions originate from a low-pressure gas discharge and are extracted by a multi-aperture extraction system. Initially, the development of broad-beam ion sources was associated with ion-beam thrusters for space propulsion. Today, however, the ion-beam sources of this type are also very common in many fields of surface treatment of materials.

The known device nearest to the present invention is an ion beam source based on ICP (inductively coupled plasma) described in http://casetechnology.com/implanter/source-.html. This is a source shown in FIG. 1A and FIG. 1B, which illustrate schematic longitudinal and transverse sectional views of the source, respectively. As shown in the drawings, the ion source, which in general is designated by reference numeral 20, has arrays 22*a* (FIG. 1) and 22*b* (FIG. 2) of permanent magnets to produce a multi-cusp magnetic field in regions remote from plasma grids 24 and an RF antenna 26 that is formed by wire coil for confining the plasma by lengthening the path of ionizing electrons and reducing their drift to the walls of the working chamber 28 of the ion source 20. The chamber 28 is short in length, relative to its transverse dimensions, and the RF antenna 26 is at an even shorter distance from the extraction electrode 24*a* of the plasma grids 24, which contains one or more extraction apertures. Reference numerals 24*b* and 24*c* designate suppression the electrode and ground electrode, respectively. The RF electric field coupled into the plasma chamber 28 maintains a low pressure ($10^{-5}$ to $10^{-2}$ Torr) discharge. Positive ions are expelled from the discharge by a negatively biased extraction electrode 24*a*.

In FIG. 1A, reference numeral 30 designates a magnetic filter which reduces the production of undesired ion species and improves the ion beam quality. High-energy ionizing electrons are confined by the magnetic filter 30 to an ion source region, where the high-energy electrons ionize gas molecules. One embodiment of the magnetic filter uses permanent magnets oriented to establish a magnetic field transverse to the direction of travel of ions from the ion source region to the ion extraction region. In another embodiment, low energy 16 eV electrons are injected into the ion source to dissociate gas molecules and undesired ion species into desired ion species (see U.S. Pat. No. 4,447,732).

The density of a plasma is dictated by the balance between production and loss processes, with the added restriction that to maintain neutrality the ion charge and electron charge densities must be equal. Energetic electrons, which are more useful for ionization, are more easily lost to the chamber walls than the slower ions unless steps are taken to return the fast electrons to the plasma P. It would also be of advantage to allow slow electrons with less than the minimum ionization energy to escape thus reducing the possibility of electron-ion recombination. A strong multi-pole magnetic field surrounding the plasma volume meets these requirements.

Normally, the ion sources of the aforementioned type use Samarium-cobalt permanent magnets of about 1.5 kilLoGauss.

The antenna 26 is supported by the base has a metallic radio frequency conducting segment mounted directly within the plasma chamber 26 to deliver ionizing energy into the gas ionization zone.

The source gas flow is from 1 to 10 sccm to sustain the plasma between pressure zones within the source 20, which operates between $1\times10^{-5}$ Torr and $1\times10^{-2}$ Torr in the chamber 26 depending upon the pumping capacity of the vacuum system for that particular operating gas. Beam current varies according to the pumping speed and the capacitance of the vacuum system. Typical injection beam current is a between a few milliamps and ninety milliamps depending on the gas flow rate and RF power.

The antenna and source are connected via a matching network 32 including variable capacitors and a step down transformer (not shown) to maximize power transferred to the load and tuning a load. The values of the variable capacitors are varied simultaneously until the best impedance match between the impedances seen looking into and out of output terminals of the RF generator 34 is attained.

The electrode assembly, which consists of the aforementioned grids 24*a*, 24*b*, and 24*c* is bounded in close proximity to the ion source 20. The extraction electrode 24*a* is used for extracting positively charged ions from the source. Ions exiting the source 20 combine downstream to form a broad beam, which is used for ion beam treatment of a silicon wafer (not shown). Individual electrodes 24*b* and 24*c* in close proximity to the extraction electrode 24*a* can be biased to either inhibit or allow backstreaming of neutralizing electrons from beam portions close to the source back to the extraction electrode 24*a*. Insulators 36 separates beam portions in close proximity to the extraction electrode 24*a* to inhibit beam crosstalk and an additional suppression electrode common to all beam portions is controllably biased to further enhance control over beam portion intensity. In a typical application, the beam is a circular beam and intensity control is maintained to assure common intensity for a given radii from the beam center.

Specific examples of other known ion sources are also disclosed in a number of patents some of which are mentioned below.

For example, U.S. Pat. No. 4,259,145 issued in 1981 to Harper, et al. discloses reactive ion etching of materials which is carried out using a low energy ion beam of controlled energy and current density. The ion beam is generated with an ion source using a single extraction grid having multiple apertures to obtain high current densities at low ion energies. A reactive gas such as $CF_4$ is introduced into the ion source and ionized to form plasma which acts as the source of ions for the beam. The plasma forms a sheath located adjacent to the single extraction grid such that the ions are extracted from the plasma through the grid apertures and form a low energy ion beam for bombarding the wafers for etching the same. The size of each of the grid apertures is about the same or smaller than the thickness of the plasma sheath adjacent the grid. The ion source is designed to produce an ion current density of about 1 $mA/cm^2$ at a low ion energy of about 10-100 electron volts. This low energy minimizes etching by physical sputtering and allows the chemical component of reactive ion etching to dominate.

U.S. Pat. No. 4,481,062 issued in 1984 to Kaufman discloses an electron-bombardment ion source that includes means defining a chamber for containing an ionized gas together with means for introducing such gas into that chamber. Disposed therein is an anode and an electron-emissive cathode. The potential impressed between the anode and the cathode to effect electron emission at a sufficient velocity to ionize the gas. Also included are means for accelerating ions out of the chamber together with means for establishing a magnetic field within the chamber that increases the efficiency of ionization of the gas by the electrons. Mounted within the chamber is an anode of non-magnetic material that defines an essentially continuous and smooth surface which encloses substantially all of the volume within which the ionization occurs except the exit for the accelerated ions out of the chamber. The entire design is such as to ensure ready removability of the different components for quick and easy cleaning.

However, the method of generation of plasma in the sources described above, including the structures of the above-mentioned patents, in principle, does not allow obtaining plasma of density sufficient for obtaining high ion current densities.

A step forward in the direction of increasing the ion current densities was made with the development of so-called electron-cyclotron resonance sources and electron Hall-drift sources.

For example, U.S. Pat. No. 6,803,585 issued to Glukhoy in 2004 discloses an electron-cyclotron resonance (ECR) type ion beam source for an ion implanter. The apparatus has a sealed plasma chamber in which plasma is excited by microwave radiation of 2.45 GHz in combination with an external magnetic field generated by permanent magnets surrounding the plasma chamber. The magnets cause electron-cyclotron resonance for the electrons of the plasma thus creating conditions for efficient absorption of the microwave energy. The same magnets generate a magnetic field, which compresses the plasma toward the center for confining the plasma within the plasma chamber. The ion source also has a microwave pumping power unit that pumps into the plasma the microwave energy. The RF pumping unit has a unique additional function of RF magnetron sputtering of solid targets converted into a gaseous working medium used for implantation in an ionized form. For obtaining elongated belt-type ion beams (having a width of 1 m or longer), the ion source may contain a microwave pumping system having several output windows arranged in series along the axis of the plasma chamber and on diametrically opposite sides thereof. The windows are continuously cleaned from the contaminants that might precipitate onto their surfaces. A standard-type sand blaster can be used for cleaning the windows.

An example of an end-Hall ion source is a device disclosed in U.S. Pat. No. 4,862,032 issued in 1989 to Kaufman, et al. A plasma-producing gas is introduced into a region defined within an ion source. An anode is disposed near one end of that region, and a cathode is located near the other. A potential is impressed between the anode and the cathode to produce electrons which flow generally in a direction from the cathode toward the anode and bombard the gas to create plasma. A magnetic field is established within the region in a manner such that the field strength decreases in the direction from the anode to the cathode. The direction of the field is generally between the anode and the cathode. The electrons are produced independently of any ion bombardment of the cathode, the magnet is located outside the region on the other side of the anode and the gas is introduced uniformly across the region.

It is long recognized that the inductively coupled plasma (ICP) sources are advantageous for use in the sources of charged particles since these sources are more durable, convenient, and cost-effective devices for plasma generation. Such sources are also used for activating gases needed for cleaning plasma-processing chambers and for incineration (abatement) of harmful gases formed during plasma processing. Application of inductive discharges has an advantage of achieving high density plasma in a wide range of gas pressures with efficient energy transfer to the plasma electrons rather than to the plasma ions as is typical of capacitively coupled RF discharges.

The heart of an industrial ICP source, which is similar to one described above in the first-mentioned reference, is an ICP antenna, which normally comprises a spiral flat coil that is located in the electrically non-conductive upper part of the working chamber and that generates an electromagnetic field that induces plasma in the chamber.

An ICP antenna loaded with plasma has mainly inductive impedance (reactance) that has to be compensated with matching-tuning network (matcher) for maintaining impedance conditions required for efficient transfer of RF power from an RF generator to the plasma-excitation antenna of the plasma source.

A main disadvantage of known industrial ICP in application to ion sources is that they cannot provide high density plasma sufficient for generation of high ion current densities due to relatively weak coupling between the antenna and the plasma.

Another common problem that occurs in ICP used in ion sources, like that shown in FIG. 1, results from a high RF voltage (a few kV) between the terminals of the inductor coil (antenna). High antenna RF voltage requires special means for adequate electrical insulation and leads to considerable capacitive coupling between the coil and plasma. The nonlinear electromagnetic interaction between the field of the RF coil and the plasma sheath around the coil immersed into plasma creates a high negative DC voltage in the sheath. The aforementioned negative DC voltage accelerates the plasma ions towards the immersed antenna coil causing its erosion and sputtering that contaminate ion beam and reduce life of the ion source.

OBJECTS AND SUMMARY OF THE INVENTION

It is an object of the present invention to provide an ion-beam source for durable generation of an ion beam of high ion currents at moderate ion energy. It is another object to provide an ion-beam source capable of forming ion beams from a wide range of working gases from one-element gases such as Ar, $O_2$, $N_2$, etc. to multi-component gases such as $SiH_4$. It is a further object to provide an ion-beam source capable of generating high current-density ion beams required for increasing efficiency and productivity of equipment used in the semiconductor production. It is another object to provide the aforementioned ion-beam source which is durable, simple in construction, inexpensive in production, convenient in use, and suitable for application in processing chambers and in space propulsion, over a wide range of gas pressures and types of working media.

The ion-beam source of the present invention contains a working chamber with means for excitation of plasma which is used as a source of ions extracted therefrom by a known method, e.g., by an ion extractor of the type described in the aforementioned prior-art references. Similar to a conventional ion-beam source, the working chamber of the ion beam source of the invention is provided with a working gas-supply system and gas-exhaust system. However, a novel feature of the ion beam source of the invention is a new method and apparatus for plasma generation. This plasma-generation apparatus comprises a plasma source having a new RF antenna cell which is deeply immersed into interior of the working chamber. The antenna cell comprises a ferrite core with an inductive coil wound onto the ferrite core. The core and the coil are surrounded and sealed in a protective cap made from a dielectric material, e.g. quartz, ceramic, or the like. Furthermore, the ferrite core is made in the form of a tubular body with a central opening and a heat conductor inserted into this opening for removal of heat from the core and the coil. The heat conductor is made of a metal or dielectric having a high coefficient of thermal conductivity, e.g. from copper, aluminum, or thermo-conductive ceramic. The heat conductor is connected to a heat sink, and the protective cap is connected to the top of the chamber. The ion source is provided with an RF power source and with a matching network for matching the output impedance of the power source to the impedance of antenna cell.

Deep immersion of the antenna cell enhanced with ferrite core into the plasma provides high coupling to plasma and thus high efficiency of the plasma production, while the spatial arrangement of the plasma cells and possibility of individual RF power adjustment thereof provide a high degree of uniformity in the plasma density and the ion beam. In order to improve the ion production and efficiency of their extraction through the ion-beam emitting opening formed in the bottom of the working chamber of the ion-bean source, the latter is provided with a plasma-confinement system that is composed of a plurality of magnets surrounding the plasma-generation chamber and that creates a multi-cusp magnetic field surrounding the plasma volume. Magnetic confinement increases plasma density and simultaneously reduces interaction of the plasma with the plasma-generation chamber.

DETAILED DESCRIPTION OF THE INVENTION

Figure 1B:
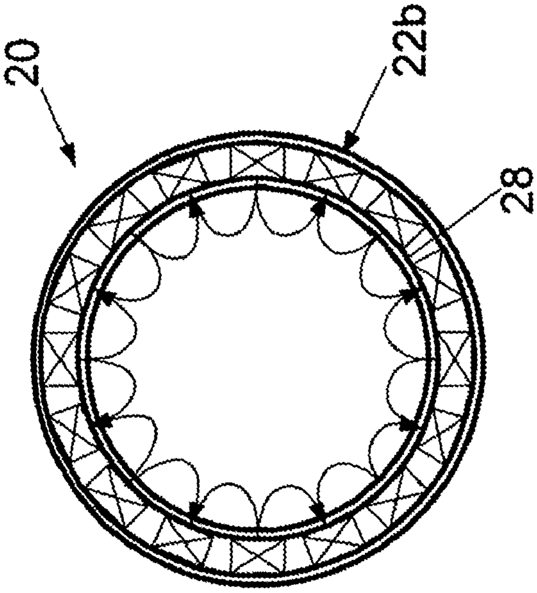
Fig. 1b PRIOR ART
FIG. 1 is a schematic view of a conventional ion source based on ICP.
Figure 1A:
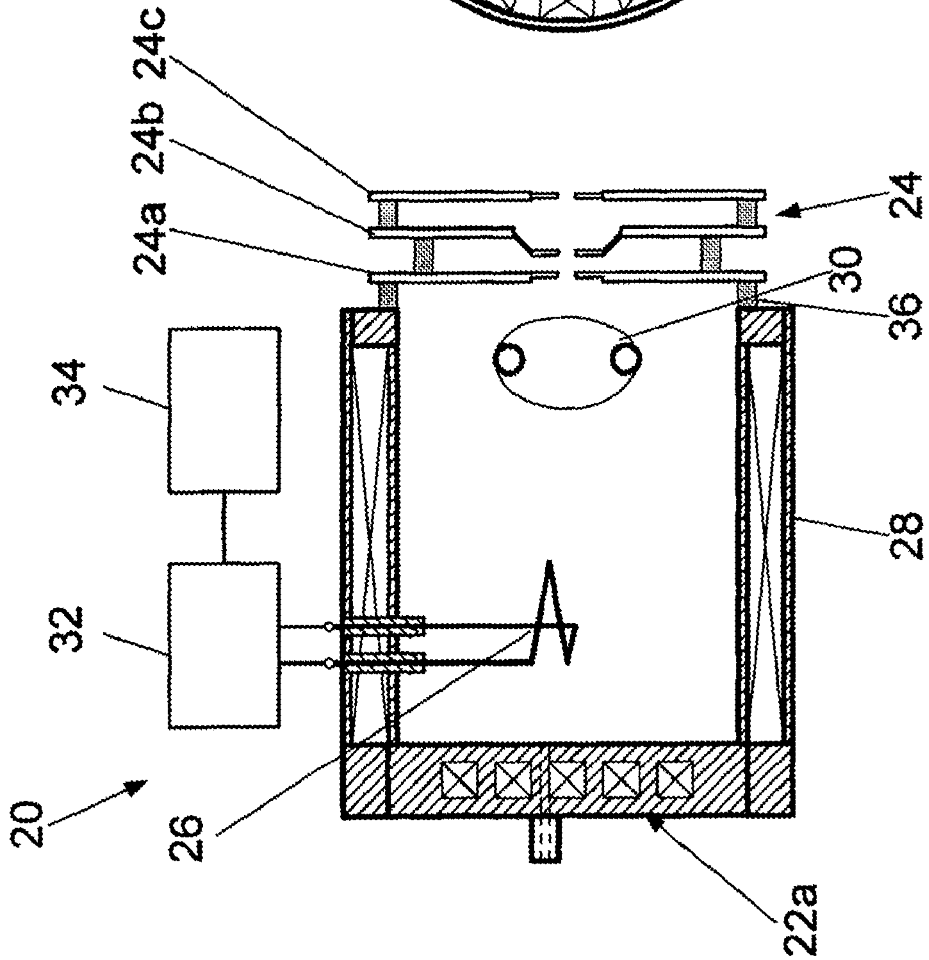
Fig.1a PRIOR ART
Figure 2:
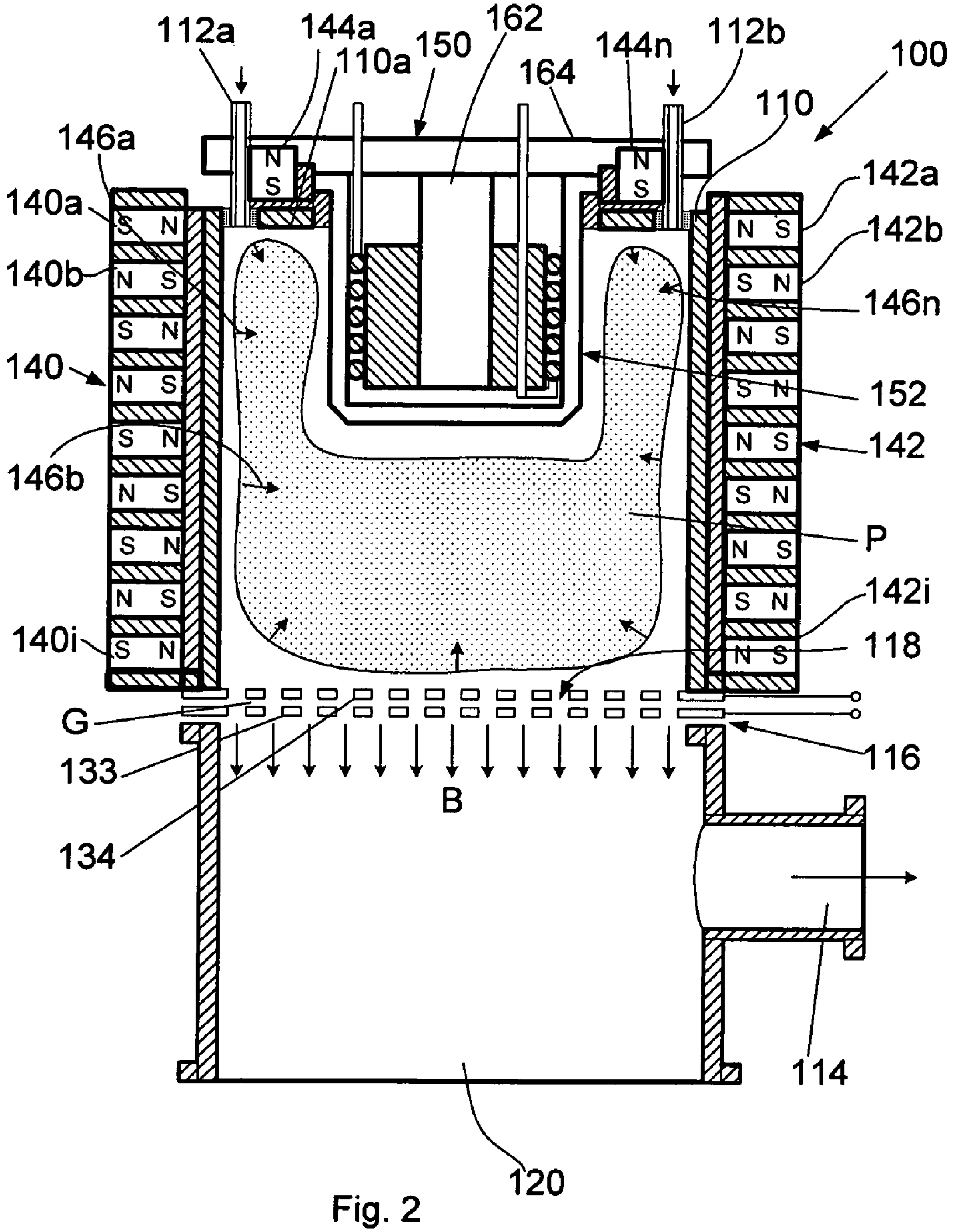
FIG. 2 is a general vertical sectional view of an ion-beam source in accordance with one embodiment of the invention.

A general vertical sectional view of an ion-beam source of the invention is shown in FIG. 2. The ion-beam source, which in general is designated by reference numeral 100 consists of a sealed working chamber 110 that is formed from a non-magnetic metal or dielectric, e.g., ceramics, and ion-beam extractor system 116 that includes two grids 133 and 134 (FIG. 2) included into the electrical circuits shown in FIG. 3. The grids 133 and 134 are positioned at an exit opening 118 of the plasma chamber 110. The ion-beam extraction unit 116 is an important element for the formation of an ion beam B.

The working chamber 110 has a working-gas input pipe or pipes 112*a* and 112*b* for admission of a working gas, such as Ar, $O_2$, $N_2$, etc., into the working chamber 110 and a gas exhaust duct 114 formed in the side wall of the lower portion 120 of the ion-beam extractor system 116.

The lower portion 120 of the ion-beam extractor system 116 can be used for placing objects (not shown) that need to be subjected to ion-beam treatment. Such an object may be exemplified by a semiconductor wafer. Also, with an opened bottom of the lower portion 120; the ion source of invention can be used as an ion beam source for space propulsion. In latter case, an external electron source has to be used to neutralize the ion beam.

As has been mentioned above, the ion-beam source 100 is also provided with an ion-beam extraction unit 116 located at the lower end of the working chamber 110.

Although a distinguishing part of the ion-beam source of the invention is a more efficient and productive plasma-generation system that will be described below, the principle of the extraction of ions from the plasma generated in the working chamber 110 will also be shortly described.

Each grid has an array of apertures to allow ions to travel through the grid during operation. Typically, the apertures of one grid are closely aligned with apertures of the other grid. The first grid (i.e., the grid closest to the plasma) 133 is called an “extraction grid” or a “screen grid”, and has a zero or slightly negative electrical potential. The second grid 134 (FIG. 2), called an “acceleration grid”, is spaced closely to the first grid and has a negative potential (e.g., −400 Volts). It is understood that the respective ion-passing apertures of the grids 133 and 134 are coaxial.

In the two-grid systems, the ion beam divergence to a great extent depends on such factors as normalized perveance per aperture, the extraction-grid-to-acceleration-grid spacing, the aperture size, the net-to-total-accelerating-potential ratio, etc. Perveance can be defined as a normalized measure of the current of ions extracted from the plasma through each aperture. The net ions impinging upon the grids and decrease in the angular divergence of the ion beam B can be controlled by adjusting the spacing G between the grids 133 and 134 and aperture opening sizes. It has been shown that the divergence angle for a two-grid ion source is in the range of 10° to 30°.

Figure 3:
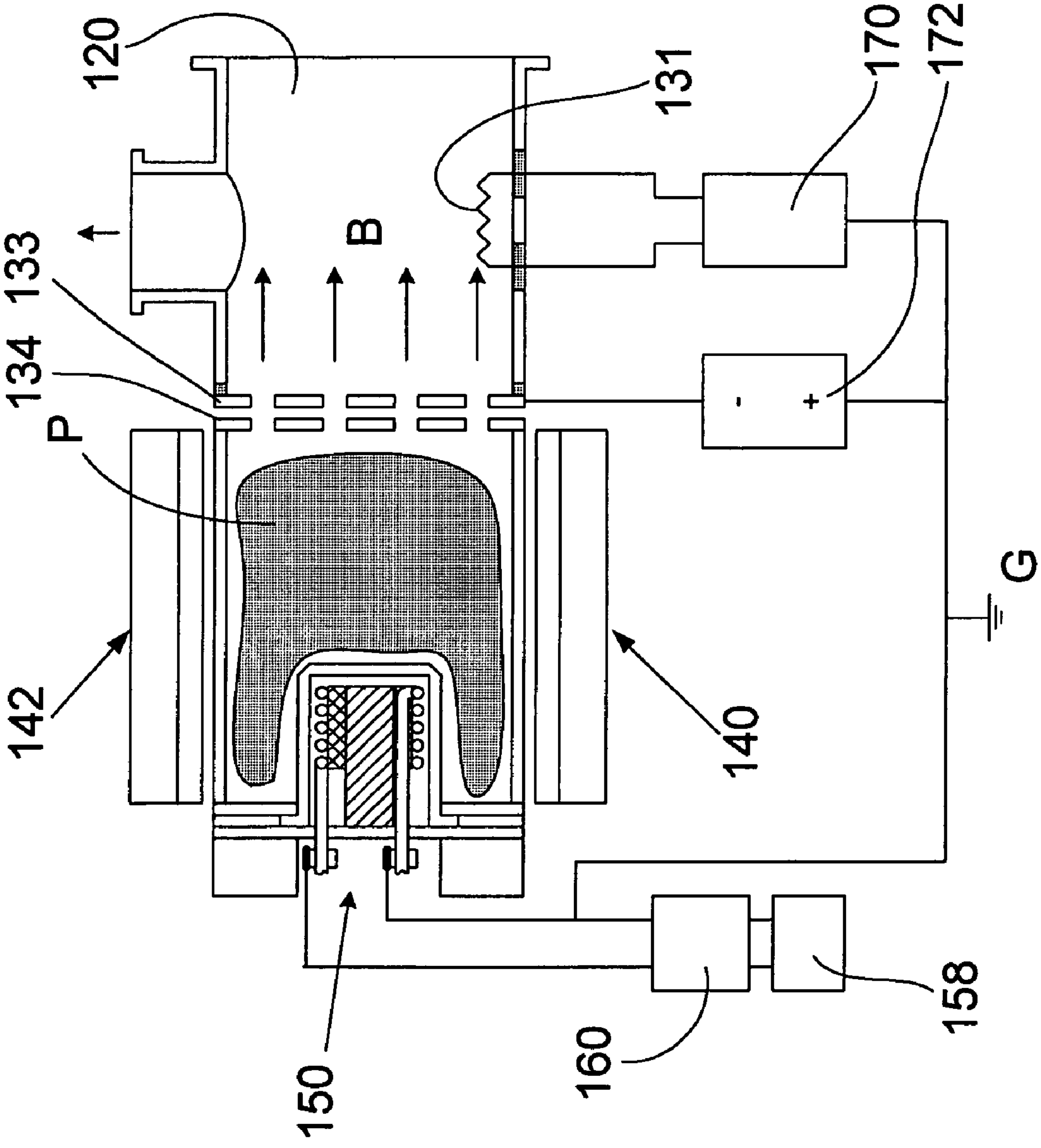
FIG. 3 is an electrical circuitry of the ion-beam source of the invention.

There may be many changes and modifications of the ion-extraction system. For example, a third grid, called a “shield grid” (not shown), can be placed in the most downstream position of the ion flow. This grid is typically spaced closely to the acceleration grid 134. In many applications, an RF excited plasma bridge neutralizer may be used of the same type as the neutralizer 131 shown in FIG. 3. The neutralizer 131 is positioned in the vicinity of the ion beam output in the space 120 (FIG. 3) and is used to provide electrons for current and space charge neutralization of the ion beam B for reducing inter-ion repulsion within the ion beam B. In FIG. 3, reference numeral 170 designates an AC power source for the neutralizer 131, and reference numeral 172 designates a high-voltage source for the ion-extraction grid 133.

In order to provide plasma confinement and increase density of the plasma P and density of current in the ion beam B, the outer periphery of the working chamber 110 is surrounded by stacks of magnets, only two of which 140 and 142 are seen in FIG. 2. It should be noted that the stacks are equally spaced in the circumferential direction around the working chamber 110. Each stack consists of a plurality of magnets having opposite neighboring polarities on the sides thereof that face the walls of the working chamber 110 (as well as on the opposite sides). Thus, the magnet stack 140 consists of permanent magnets 140*a*, 140*b*, . . . 140*i*, and the magnet stack 142 consists of permanent magnets 142*a*, 142*b*, . . . 142*i*, Another set of permanent magnets is formed by a group of magnets circumferentially arranged on the outer side of the upper cover 110*a* of the working chamber. Although only two such magnets 144*a* and 144*n* are shown in FIG. 2, it is understood that the magnets 144*a* through 144*n* are circumferentially equally spaced and have opposite neighboring polarities.

The arrangement of magnets 140*a*, 140*b*, . . . 140*i*, 142*a*, 142*b*, . . . 142*i*, 144*a* and 144*n*, etc. generate special magnetic field that confines plasma P in the inward direction shown in FIG. 2 by arrows 146*a*, 146*b*, . . . 146*n*.

As has been mentioned above, a distinguishing feature of the invention is a plasma-generation unit, which is shown in FIG. 2 and is designated by reference numeral 150. The main part of the plasma-generation unit 150 is an RF-antenna cell 152, which is shown separately on a larger scale in FIG. 4. The RF-antenna cell 152 is comprised of a tubular ferromagnetic core 154 and an induction coil 156 wound around the core 154 and connected to an RF power source 158 via a matching network 160. In the embodiment shown in FIG. 4, the induction coil 156 consists of two windings 156*a* and 156*b* wound bifilarly on the core 154.

The aforementioned two windings 156*a* and 156*b* provide the antenna with a self-balancing property without need in the symmetrical drive with a balanced RF matching network.

Figure 5:
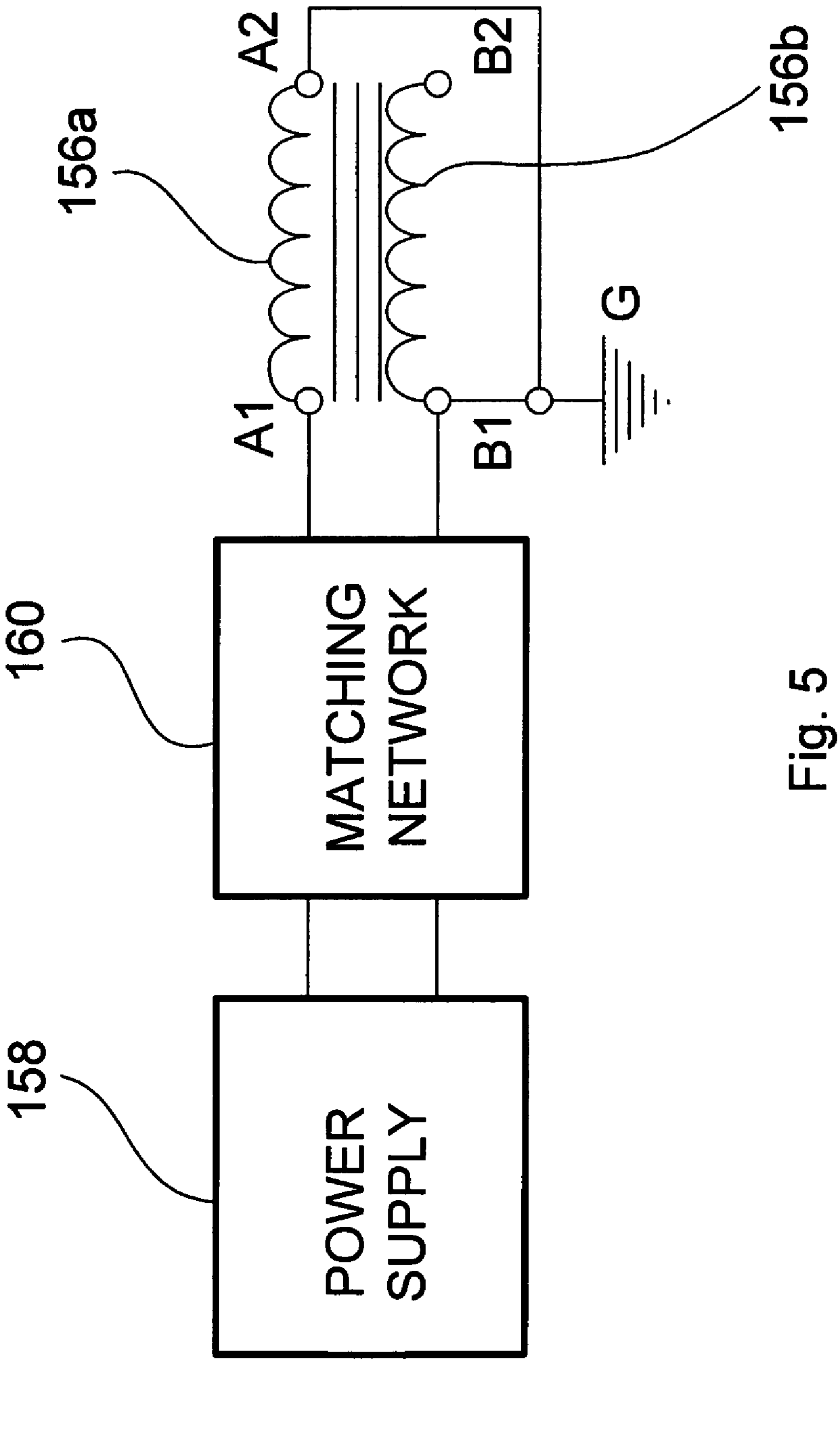
FIG. 5 is a simplified electric circuit that shows connection of the antenna-cell windings to a power-supply unit.

A simplified electrical connection of the windings 156*a* and 156*b* of the RF antenna cell 152 to the power supply 158 is shown in FIG. 5. Self-balancing of the antenna is achieved with an additional coil winding 156*b* wound bifilarly (parallel) to the main antenna coil 156*a*.

The first end A1 of the main coil winding 156*a* is connected to the RF terminal of an asymmetric matching network 160, while its second end A2 is connected to the grounded terminal G of the matching network 160. Due to strong coupling provided by ferromagnetic core 154 (FIG. 4) and close proximity of the two coil windings 156*a* and 156*b*, the RF voltage induced in the second coil winding 156*b* is equal to RF voltage applied to the main coil winding 156*a*. Since the first end B1 of the second coil winding 156*b* is connected to the ground, the second free end B2 of the second coil winding 156*b* has RF potential equal in magnitude but opposite in phase to RF potential of the first end A1 of the main coil winding 156*a*. As a result, the antenna (comprised of two coil windings 156*a* and 156*b*) has on its ends equal RF voltages of opposite phase, thus being balanced without need of symmetric matching network or balancing capacitor.

The antenna cell 150 is inserted deep into the working chamber 110 (FIG. 2), and therefore, as a result of the diffusion process, the plasma fills the volume of the working chamber 110 substantially uniformly.

Figure 4:
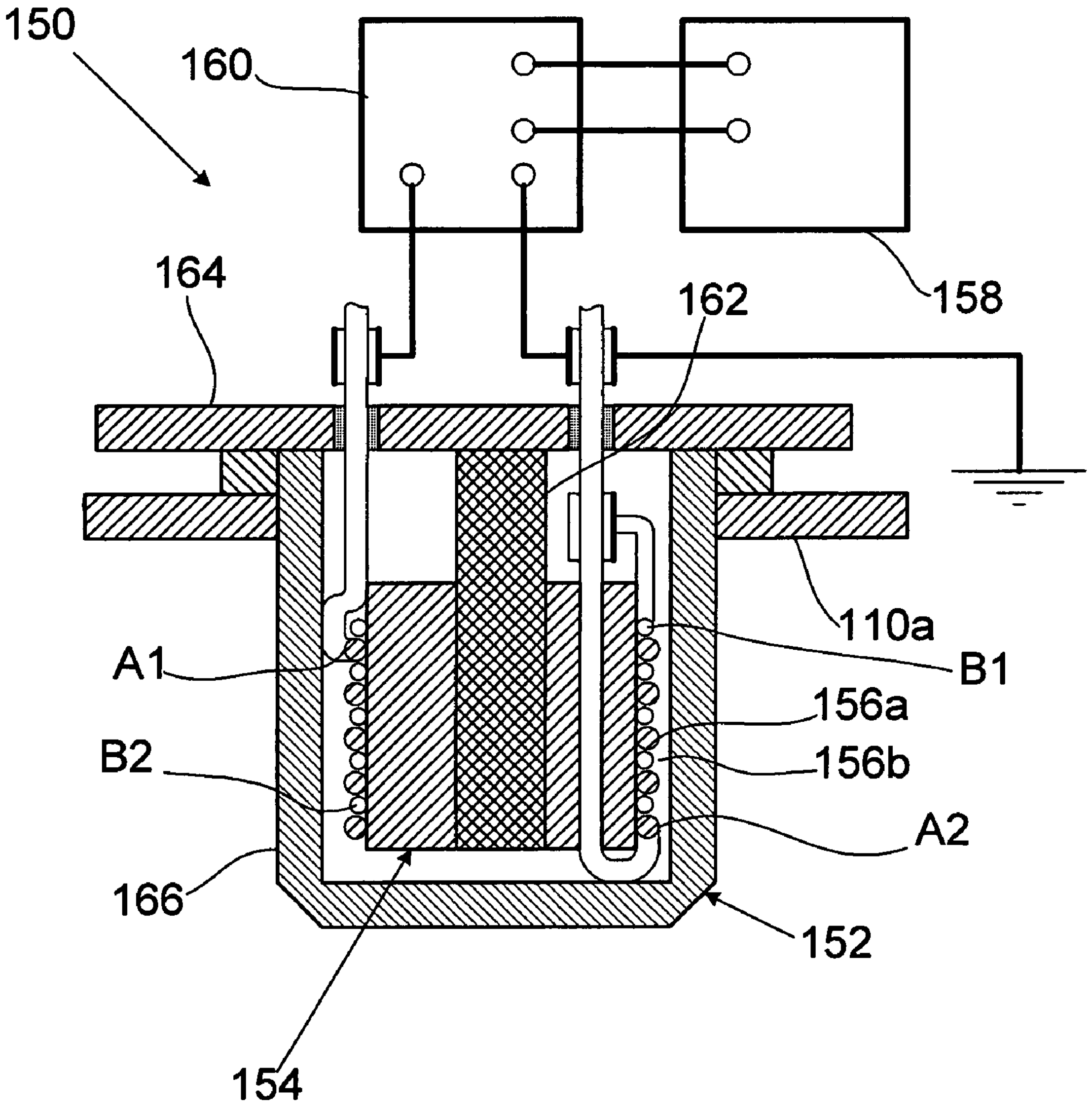
FIG. 4 is a sectional view of an antenna cell of the invention shown on larger scale than in FIG. 2.

Inserted into the tubular core 154 of the RF-antenna cell 152 is a heat conductor 162 which has heat-transmitting contact with a heat sink 164 (FIGS. 2 and 4). The cell 152 is covered with a protective cap 166 made of a dielectric material (Quartz, ceramic, glass, silicon-carbide). The cap 166 is vacuum-sealed on the chamber top 110*a*.

The ion-beam source 100 of the invention operates as following. The working chamber 110 is evacuated though the outlet port 114 (FIG. 2). The space 120 is either closed and sealed by a cover (not shown) or is connected to a vacuum volume (not shown). The working gas, e.g., argon, is supplied into the chamber 110 through the working gas supply tubes 112*a* and 112*b*. The pressure in the working chamber 110 is adjusted to a value required for the process, e.g., in the range $10^{-5}$ to 1 Torr.

The power supply 158 (FIGS. 3 and 4) energizes the antenna cells 150. After being energized, the antenna cell 150 generates RF plasma P. Since the antenna cell 150 is enhanced with ferromagnetic core 154 and is deeply immersed into the cavity of the working chamber 110, it provides more efficient coupling of RF energy into the plasma. The magnet stacks 140, 142, 144*a*, . . . 144*n* confines the plasma P in the direction away from the inner walls of the working chamber 110.

Since the antenna coil 156 (FIG. 4) is provided with the core 154 of a ferromagnetic material of high permeability ($\mu >> 1$), this core intensifies electromagnetic coupling of the antenna cell 150 to plasma P, which, in turn, intensifies the plasma production efficiency and plasma manageability. In addition, the core 154 increases the antenna inductance L, resulting in reduction of the coil magnetizing current $I_c \sim 1/(\omega L)$, and in significant reduction of the power loss in the antenna coil, $P_c \sim I_c^2 \sim 1/L^2$. This leads to increase in the ICP (inductively coupled plasma) generation efficiency as compared to conventional ICP generation systems used in the ion-beam sources. Reduction in the antenna power loss enables ICP to operate at small plasma density, since the minimal plasma density needed for a stable ICP operation is nearly equal to the ICP antenna power loss $P_c$. Increase in the coupling and in the antenna inductance (due to application of ferromagnetic core) allows for considerable reduction (up to 1-2 orders of magnitude) of ICP operating frequency comparing to conventional ICP operated at 13.56 MHz. The possibility of working on frequencies much lower than 13.56 MHz results in considerable cost reduction of the power source and matching network.

Furthermore, application of the ferromagnetic core 154 allows for considerable reduction in the antenna size to make it much smaller than in conventional ICPs of known ion-beam sources. Due to the fact that the antenna cell 150 may be embodied with a small diameter and occupy a small part of the working-chamber volume, the capacitive coupling of the antenna of the invention to plasma may be significantly reduced comparing to that in a conventional ICP source with a large coil placed on the window or recessed into working chamber of the conventional ion-beam sources.

The capacitive coupling reduction, and thus reduction in RF voltage across the sheath between the antenna protective cap 152 and plasma P, reduces antenna cell erosion and sputtering, thus significantly increasing the ion-source life. Reduction of capacitive coupling results from many features of the RF antenna 150 used in the ion-beam source 100. First, it is due to a smaller surface of the inductor in comparison with the conventional one, which is achieved by introduction of the ferromagnetic core 154 (FIG. 4). Second, it is due to a reduced discharge voltage along the reduced plasma current path around the antenna. Third, it is due to the antenna self-balancing with the second coil 156B.

Although the embodiment of FIGS. 2, 3, and 4 describes a single-antenna ion-beam source, the principle of the invention will not be violated if the single antenna is replaced by a plurality of RF antennas made according to the present invention.

Thus, it has been shown that the present invention provides an ion-beam source for generation of an ion beam having several advantages comparing to existing ion sources. The ion-beam source of the invention is capable of forming ion beams from a wide range of working gases from one-element gases such as Ar, $O_2$, $N_2$, etc. to multi-component gases such as $SiH_4$ in a wide range of gas pressures. The ion-beam source of the invention is capable of efficiently generating high current-density ion beams required for space-propulsion and plasma-processing equipment used in the semiconductor manufacturing and treatment of materials. The ion-beam source is simple in construction, inexpensive in production, and convenient in use, and suitable for application in processing chambers with a wide range of gas pressures and types of working media.

Although the invention has been shown and described by way of specific examples, it is understood that various changes and modifications are possible with regard to materials, shapes, and dimensions, without departure from the scope of the patent claims. For example, different number of ferromagnetic antennas and different patterns of symmetry (round, square, rectangular, hexagonal, or few rings arrays and others) can be arranged over the processing chamber of different shapes to obtain a desirable processing pattern and degree of plasma uniformity. Individual antenna cells can be immersed into the working chamber to different levels.

The invention claimed is:

1. An ion-beam source comprising a plasma generation unit operable to generate a plasma and an ion-extraction unit operable to extract ions from the generated plasma, wherein:

the ion-extraction unit comprises at least one grid operable to be maintained under a negative potential relative to ground; and the plasma generation unit comprises:

a working chamber comprising a working gas supply channel, a working gas outlet port, a side wall, and a top wall, the chamber being operable to be sealed and evacuated, an antenna cell deeply immersed into the working chamber, an RF power supply operable to supply RF power having a frequency selected from the range consisting of 0.1 to 50 MHz, a matching network connected between the RF power supply and the antenna cell, the matching network being operable to sufficiently match an impedance of the RF power supply with an impedance of the antenna cell to generate plasma in the working chamber; and wherein the antenna cell comprises:

a ferromagnetic core, an induction coil wound onto the ferromagnetic core, and a cap made from a dielectric material operable to sealingly cover the ferromagnetic core and the induction coil; and wherein the induction coil comprises:

a first inductive coil winding and a second inductive coil winding wound on the aforementioned ferromagnetic core, each of the inductive coil windings having a first inductive coil winding end and a second inductive coil winding end; the first end of the first inductive coil winding being electrically connected to a first output terminal of the matching network, the second end of the first inductive winding being electrically connected to the first end of the second inductive winding and to a ground, and a second output terminal of the matching network being electrically connected to the ground.

2. The ion-beam source of claim 1, wherein the ferromagnetic core of the antenna cell has a tubular shape with a central opening, a heat conductor made from a material of high thermal conductivity is inserted into the opening, the plasma generation unit further comprises a heat sink thermally connected to the heat conductor, and the cap is vacuum sealed to a wall of the chamber selected from the group consisting of a top wall and a side wall of the chamber.

3. The ion-beam source of claim 2, wherein the high thermal conductivity heat conductor material is a metal.

4. The ion-beam source of claim 1, wherein the cap is made from a non-electrically conductive material of high thermal conductivity.

5. The ion-beam source of claim 3, wherein the cap has high thermal conductivity.

6. The ion-beam source of claim 1, wherein the first inductive coil winding and the second inductive coil winding are bifilarly wound together.

7. The ion-beam source of claim 1, wherein the ferromagnetic core is made from a material having magnetic permeability $\mu$ in the range of 10 to 3000.

8. The ion-beam source of claim 2, wherein the ferromagnetic core is made from a material having magnetic permeability $\mu$ in the range of 10 to 3000.

9. The ion-beam source of claim 6, wherein the ferromagnetic core is made from a material having magnetic permeability $\mu$ in the range of 10 to 3000.

* * * * *